US009454975B2

(12) United States Patent
Ubale

(10) Patent No.: US 9,454,975 B2
(45) Date of Patent: Sep. 27, 2016

(54) VOICE TRIGGER

(71) Applicant: Nvidia Corporation, Santa Clara, CA (US)

(72) Inventor: Anil W. Ubale, Cupertino, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 305 days.

(21) Appl. No.: 14/074,440

(22) Filed: Nov. 7, 2013

(65) Prior Publication Data

US 2015/0127335 A1 May 7, 2015

(51) Int. Cl.

| | |
|---|---|
| ***G10L 15/00*** | (2013.01) |
| ***G10L 25/78*** | (2013.01) |
| *G10L 25/00* | (2013.01) |
| *G10L 21/00* | (2013.01) |
| *G06F 1/00* | (2006.01) |
| *H03G 3/20* | (2006.01) |
| *H03F 99/00* | (2009.01) |
| *H04B 3/20* | (2006.01) |
| *H04B 15/00* | (2006.01) |
| *H04R 29/00* | (2006.01) |
| *G10L 15/22* | (2006.01) |

(52) U.S. Cl.
CPC .......... *G10L 25/78* (2013.01); *G10L 2015/223* (2013.01)

(58) Field of Classification Search
USPC ............... 704/225, 233, 231, 275, 223, 235; 341/143; 381/57, 120, 66, 94.3, 56; 707/100; 714/799; 315/291; 713/323; 379/406.01
See application file for complete search history.

(56) References Cited

U.S. PATENT DOCUMENTS 5,012,519 A * 4/1991 Adlersberg ......... G10L 21/0208 704/225
8,521,530 B1 * 8/2013 Every ..................... H04M 9/08 381/66

(Continued)

*Primary Examiner* — Pierre-Louis Desir
*Assistant Examiner* — Neeraj Sharma

(57) ABSTRACT

Voice trigger. In accordance with a first method embodiment, a long term average audio energy is determined based on a one-bit pulse-density modulation bit stream. A short term average audio energy is determined based on the one-bit pulse-density modulation bit stream. The long term average audio energy is compared to the short term average audio energy. Responsive to the comparing, a voice trigger signal is generated if the short term average audio energy is greater than the long term average audio energy. Determining the long term average audio energy may be performed independent of any decimation of the bit stream.

19 Claims, 2 Drawing Sheets

(56) References Cited

U.S. PATENT DOCUMENTS 8,892,450 B2 * 11/2014 Schildbach ........... G10L 19/173 379/406.01
8,990,073 B2 * 3/2015 Malenovsky ........... G10L 25/78 381/94.3
2003/0101052 A1 * 5/2003 Chen ....................... G10L 15/10 704/223
2009/0259672 A1 * 10/2009 Garudadri ............. G10L 19/005
2009/0259922 A1 * 10/2009 Garudadri ............. G10L 19/005 714/799
2009/0309774 A1 * 12/2009 Hamashita .............. H03M 3/42 341/143
2010/0322441 A1 * 12/2010 Weiss ........................ G06F 1/26 381/120
2011/0235813 A1 * 9/2011 Gauger, Jr. ............. G10L 21/02 381/57
2011/0291584 A1 * 12/2011 Filippo ................... G06F 7/602 315/291
2014/0006825 A1 * 1/2014 Shenhav ............... G06F 1/3206 713/323
2014/0229184 A1 * 8/2014 Shires ..................... H04L 12/12 704/275
2014/0244253 A1 * 8/2014 Bringert .................. G10L 15/28 704/235
2014/0278393 A1 * 9/2014 Ivanov .................... G10L 15/20 704/233
2014/0281628 A1 * 9/2014 Nigam .................. G06F 1/3206 713/323
2014/0358552 A1 * 12/2014 Xu ........................ G06F 1/3234 704/275
2015/0106089 A1 * 4/2015 Parker ................... G06F 1/3206 704/235
2015/0205342 A1 * 7/2015 Ooi ....................... G06F 1/3206 713/323
2015/0245154 A1 * 8/2015 Dadu ...................... G06F 3/167 381/56

* cited by examiner

100

VOICE TRIGGER

FIELD OF INVENTION

Embodiments of the present invention relate to the field of digital signal processing. More specifically, embodiments of the present invention relate to systems and methods for voice triggers.

BACKGROUND

It is desirable for portable electronic systems, e.g., "smart" phones, tablets, and/or personal digital assistants, "wearable" electronic systems, including, e.g., "smart" watches and/or glasses, to include voice recording, voice recognition and/or voice command functionality.

One impediment to the use of such voice functions relates to the power consumption of such features. A portably device typically has a limited energy capacity, also known as battery life. In general, the power consumption of a voice recognition feature, e.g., power consumed by hardware and software executing on a processor, has generally been deemed to be too great to enable such a feature at all times. Consequently, most implementations of a voice recognition/command feature require a manual activation or trigger for such features. For example, a user must activate a physical button for two seconds in order to trigger a voice recognition function. The need for a "non-voice" trigger to enable a voice function reduces the application and effectiveness of such voice functions.

SUMMARY OF THE INVENTION

Therefore, what is needed are systems and methods for voice triggers that provide reduced power consumption. What is additionally needed are systems and methods for voice triggers that eliminate a need for decimation for generating a voice trigger. A further need exists for systems and methods for voice triggers that are compatible and complementary with existing systems and methods of electronic device design and manufacture, and digital signal processing. Embodiments of the present invention provide these advantages.

In accordance with a first method embodiment, a long term average audio energy is determined based on a one-bit pulse-density modulation bit stream. A short term average audio energy is determined based on the one-bit pulse-density modulation bit stream. The long term average audio energy is compared to the short term average audio energy. Responsive to the comparing, a voice trigger signal is generated if the short term average audio energy is greater than the long term average audio energy. Determining the long term average audio energy may be performed independent of any decimation of the bit stream.

In accordance with another embodiment of the present invention, an apparatus includes a bit buffer configured to receive a one-bit pulse-density modulation bit stream and a counter configured to count a number of one bits in a portion of the bit buffer. The apparatus also includes a long term energy averaging circuit configured to perform an exponential averaging of a series of energy values based on the number with a long term time constant, producing a long term average energy and a short term energy averaging circuit configured to perform an exponential averaging of a series of energy values based on the number with a short term time constant, producing a short term average energy. The apparatus further includes a comparator configured to compare the short term average energy to the long term average energy. The comparator also configured to produce a voice trigger signal if the short term average energy is greater than the long term average energy.

In accordance with a further embodiment of the present invention, a method includes determining audio energy of a one-bit pulse-density modulation (PDM) bit stream by counting a number of one bits within a portion of the bit stream. The method may be free of decimation of the pulse-density modulation (PDM) bit stream.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

DETAILED DESCRIPTION

Figure 1:
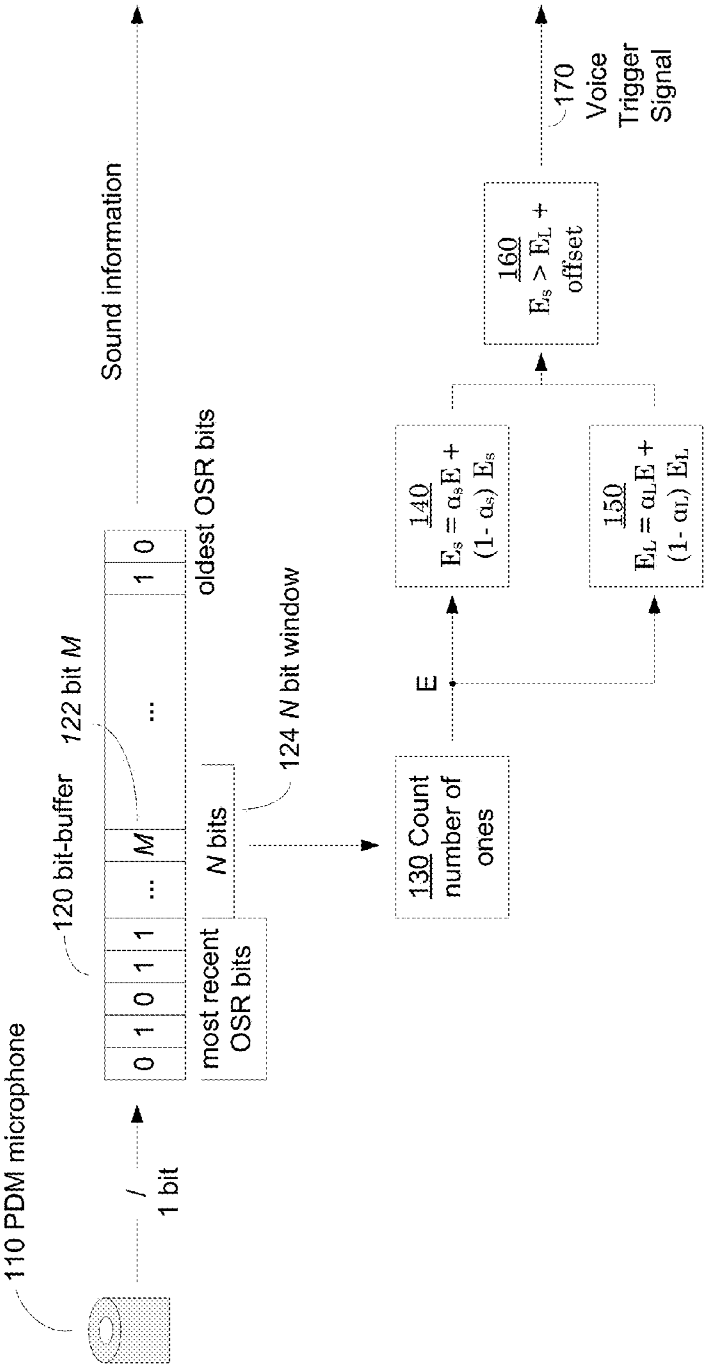
FIG. 1 illustrates an exemplary block diagram of circuitry to determine a voice trigger signal, in accordance with embodiments of the present invention.

Reference will now be made in detail to various embodiments of the present invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

Some portions of the detailed descriptions which follow (e.g., method 200) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "determining" or "comparing" or "setting" or "accessing" or "placing" or "testing" or "forming" or "mounting" or "removing" or "ceasing" or "stopping" or "coating" or "attaching" or "processing" or "performing" or "generating" or "adjusting" or "creating" or "executing" or "continuing" or "indexing" or "computing" or "translating" or "calculating" or "measuring" or "gathering" or "running" or the like, refer to the action and processes of, or under the control of, a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The term "decimation," as used by those of ordinary skill in the digital signal processing arts and herein refers to or describes a process of digital processing used to convert a one-bit pulse-density modulation (PDM) bit stream to a pulse-code modulation (PCM) series of multi-bit words, generally without aliasing.

Voice Trigger

Under the conventional art, a one-bit pulse-density modulation (PDM) input signal is filtered and/or decimated to produce a multi-bit linear pulse-code modulation (PCM) signal. Then the energy of the input sample is calculated and averaged. The averaging is typically performed using a leaky integrator or exponential averaging operation. The pulse-density modulation (PDM) or decimator receiver typically retrieves a multi-bit audio signal from a one-bit PDM microphone signal. Typically, the decimator or PDM receiver runs all the time when any audio processing is performed. The decimator or PDM receiver is followed by an energy computation block, which can be run in a separate hardware block or on a DSP processor. The audio signal is buffered so that when the energy computation block finds an audio segment with an energy level above the background or ambient energy level it can activate voice-trigger phrase recognition algorithm. A voice-trigger phrase recognition algorithm analyzes the buffered audio signal and matches it with a voice-trigger phrase.

In accordance with embodiments of the present invention, a voice trigger does not require decimation and filtering to calculate the energy of the input audio samples. In contrast, a voice trigger function is performed prior to, e.g., independently of, any decimation and/or filtering, which may be required by subsequent signal processing. Accordingly, the high energy cost of decimation and/or filtering may be avoided until and unless sufficient audio energy is present to indicate a possibility of a valid voice signal.

In accordance with embodiments of the present invention, a voice trigger function counts a number of ones and zeros in a predetermined sliding window of bits in the past history of the input pulse-density modulation (PDM) signal. The energy of the signal is directly related to the normalized count. The logic to perform counting is extremely small and may operate at a very low clock rate. For example, counting logic may operate at an audio sample rate, e.g., 48 kHz. Thus, every 1/48 milliseconds, the count logic counts the number of ones and performs a running average to determine an average energy level of the input signal.

The basis for this calculation is the low-pass filtering needed for decimation of a one-bit pulse-density modulation (PDM) signal. This filter has an impulse response that peaks in the past and the past one-bit samples contribute to the decimated output with a disproportionately high weight. Therefore, other PDM bits may be ignored, resulting in a very accurate estimate of the input signal level just by looking at a small number (N) of one-bit samples in the history of the input PDM signal centered at $M^{th}$ bit in the past.

FIG. 1 illustrates an exemplary block diagram of circuitry 100 to determine a voice trigger signal, in accordance with embodiments of the present invention. An audio signal comprising background ambient noise and possible a voice signal is received at pulse-density modulation (PDM) microphone 110. PDM microphone 110 typically comprises a microphone element, e.g., an electret capsule, an analog preamplifier, and a PDM modulator. PDM microphone 110 outputs a one-bit binary signal which is sampled, e.g., oversampled, at a rate much higher than the Nyquist-Shannon rate corresponding to the desired audio bandwidth. For a mobile telephone application, for example, a typical audio sample rate may be 48 kHz. The oversample rate, or "OSR," may be 64.

In addition, circuitry 100 comprises a bit-buffer 120. Bit-buffer 120 comprises a queue data structure that receives and holds the bit samples or audio data received from PDM microphone 110. In accordance with an embodiment of the present invention, the buffer may be comprise five times the oversample rate, or 5*OSR, bits. It is appreciated that bits move from left to right in bit-buffer 120. The most recent bit is the left most bit in bit-buffer 120, while the oldest bit is the right most bit in bit-buffer 120. Every OSR interval, a new bit is added to the left of bit-buffer 120, and the oldest bit is clocked out the right side of bit-buffer 120.

Associated with bit-buffer 120, there is an N bit window 124 centered on bit M 122 within bit-buffer 120. N may be equal to the oversample rate, e.g., 64. In accordance with embodiments of the present invention, N bit window 124 comprises a portion, e.g., a window, of a PDM bit stream within bit-buffer 120 that is delayed. Bit M 122 may be the "middle" bit of bit-buffer 120, but that is not required. Similarly, N may be some other value not equal to OSR. The approximation to instantaneous energy improves as N increases. However, increases in N also increase the number of operations required to determine instantaneous energy. Thus, the value of N provides a trade-off among power consumption and accuracy of results. For example, if OSR=64, and M=5*OSR/2-5, then N bit window 124 may start at the $M-(N/2)=123^{rd}$ bit of bit-buffer 120. In this manner, N bit window 124 represents delayed or "historical" audio data.

Counter 130 counts a number of ones within N bit window 124 of bit-buffer 120. This count is denoted as "L." The instantaneous energy level of the input signal, denoted as "E," is expressed by Relation 1, below:

$$E=|(2L-N)/N|=|2L/N-1| \quad \text{(Relation 1)}$$

Block 140 computes a short-term average energy, denoted as "Es," as expressed by Relation 2, below. Relation 2 computes an exponential average of a series of energy values, based on a short term time constant, αs. An exemplary time constant of about 20 ms may be used for short-term averaging to detect speech activity. At an exemplary sample rate of 8000 Hz, as may be approximately 0.00625.

$$E_s=\alpha_s E+(1-\alpha_s)E_s \quad \text{(Relation 2)}$$

Block 150 computes a long-term average energy, denoted as "$E_L$," as expressed by Relation 3, below. Relation 3 computes an exponential average of a series of energy values, based on a long term time constant, $\alpha_L$. The long term time constant $\alpha_L$ should be selected such that $E_L$ changes more slowly than $E_s$. An exemplary time constant of about 1 second may be used for longer-term averaging to detect ambient noise or a noise floor. At an exemplary sample rate of 8000 Hz, $\alpha_L$ may be approximately 0.000125.

$$E_L=\alpha_L E+(1-\alpha_L)E_L \quad \text{(Relation 3)}$$

It is also possible to compute instantaneous energy per frame (e.g., 1 ms frames) by summing instantaneous sample energies of 8 samples at 8000 Hz sample rate. The short-term and long-term energy averaging can then be applied on frame energies instead of sample energies in Relations 2 and 3. This reduces the computational work-load further since the exponential averaging and comparison is carried out every $8^{th}$ sample instead of every sample. The time-constants should be appropriately scaled to match the new update rate, for example, as ~=0.05 and $\alpha_L$~=0.001.

Asymmetric exponential averaging may also be used. For example, when a device moves from high-noise environment to low-noise environment, the slow averaging of the long-term energy may result in false-negatives. In such a case, it may be helpful to use a faster time-constant when the current instantaneous energy is lower than average energy, in comparison to when the current instantaneous energy is higher than the average energy. Relations 2 and 3, above, may be generalized to include asymmetric exponential averaging to obtain relations 4 and 5, below:

$$E_s=\alpha_{s\_up}E+(1-\alpha_{s\_up})E_{s\ if(E>Es+Thr1)} \quad \text{(Relation 4.A)}$$

$$E_s=\alpha_{s\_dn}E+(1-\alpha_{s\_dn})E_{s\ if(E<=Es+Thr1)} \quad \text{(Relation 4.B)}$$

$$E_L=\alpha_{L\_up}E+(1-\alpha_{L\_up})E_{L\ if(E>EL+Thr2)} \quad \text{(Relation 5.A)}$$

$$E_L=\alpha_{L\_dn}E+(1-\alpha_{L\_dn})E_{L\ if(E<=EL+Thr2)} \quad \text{(Relation 5.B)}$$

In comparator 160, the short term average energy $E_s$ is compared to the long term average energy $E_L$. If the short term average energy $E_s$ is greater than the long term average energy $E_L$, plus an optional offset level, e.g., if the present sound energy level is greater than the longer term background noise level, then a potentially valid voice signal is present, and the voice trigger signal 170 is generated.

It is appreciated that circuitry 100, except for PDM microphone 110, is well suited to hardware and/or software implementations, and all such embodiments, including combinations of hardware and software, are considered within the scope of the present invention.

In response to voice trigger signal 170, other audio processing (not illustrated) maybe enabled, e.g., powered on, to process the audio stream to determine if voice and/or a valid command phase and/or speech is present in the audio stream.

In accordance with embodiments of the present invention, no audio processing, e.g., decimation and/or filtering, is required until a voice trigger signal 170 is generated. Long term and short term audio-energy averages may be determined and compared without decimation and/or filtering. In contrast, under the conventional art, a one-bit PDM input signal is filtered and decimated to produce a multi-bit pulse-code modulation (PCM) signal. Audio-energy determinations are then made on PCM data sets, e.g., in PCM-space, after such filtering and decimation.

In addition to avoiding the energy cost of filtering and/or decimation, embodiments in accordance with the present invention determine and compare long term versus short term energy averages to render a voice trigger signal, e.g., voice trigger signal 170, in a more energy efficient manner. In general, it is simpler, requires less circuitry and less energy, to count bit values within bit-buffer 120, calculate and compare the long-term and short-term energies based on such counts, in comparison to processing PCM data sets, e.g., after filtering and decimation, as is typical under the conventional art.

Accordingly, embodiments in accordance with the present invention enable active "listening" for voice commands at a substantially decreased energy cost, in comparison to the conventional art. Beneficially, embodiments in accordance with the present invention may "listen" for voice commands for greater periods of time, e.g., such devices may always "listen."

Figure 2:
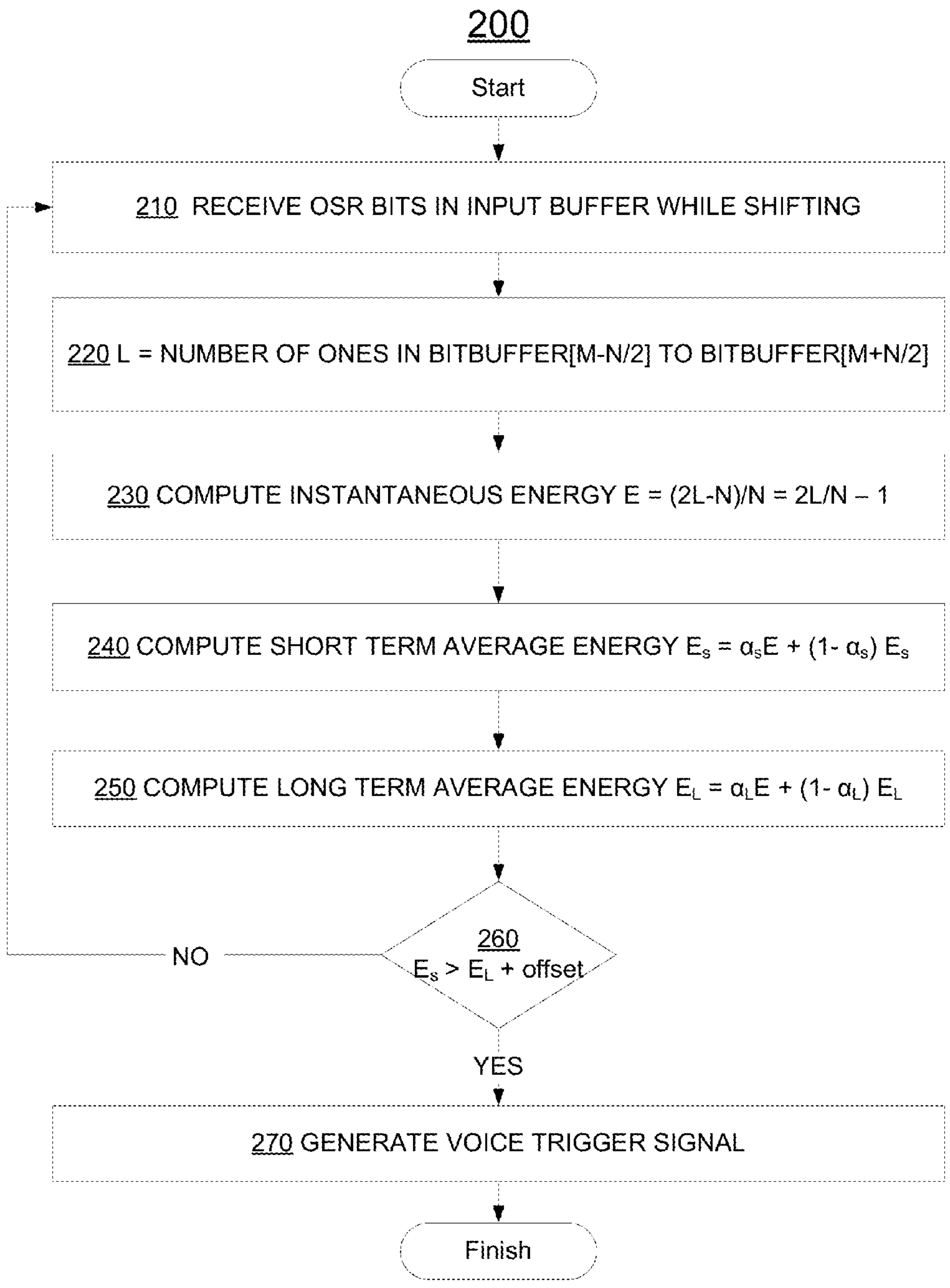
FIG. 2 illustrates a method, in accordance with embodiments of the present invention.

FIG. 2 illustrates a method 200, in accordance with embodiments of the present invention. In 210, a quantity OSR, the oversample rate, of bits of PDM audio data are received in an input buffer. The buffer contents are shifted while receiving. In 220, the number of one bits in an N-bit window centered on the Mth bit of the buffer is counted. This quantity is designated as L.

In 230, the instantaneous energy E=|(2L−N)/N|=|2L/N−1| is computed. In 240, the short term average energy Es=αsE+(1−αs) Es is computed. In 250, the long term average energy $E_L=\alpha_L E+(1-\alpha_L)$ EL is computed.

In 260, the short term average energy $E_s$ is compared to the long term average energy $E_L$. If the short term average energy $E_s$ is greater than the long term average energy $E_L$, plus an optional offset level, e.g., if the present sound energy level is greater than the longer term background noise level, then a potentially valid voice signal is present, and the process flow continues at 270. If the short term average energy $E_s$ is less than the long term average energy $E_L$, plus an optional offset level, e.g., if the present sound energy level is below the level of the longer term background noise, then no voice signal is present, and process flow resumes at 210.

In 270, responsive to a determination of short term average energy $E_s$ is greater than the long term average energy $E_L$, plus an optional offset level, a voice trigger signal, e.g., voice trigger signal 170 of FIG. 1, is generated. Such a voice trigger signal may enable, e.g., turn on, additional audio processing circuitry and/or software (not illustrated) to determine if voice and/or a valid command phase or speech is present in the audio stream.

Embodiments in accordance with the present invention provide systems and methods for voice triggers that provide reduced power consumption. In addition, embodiments in accordance with the present invention eliminate a need for decimation for generating a voice trigger. Further, embodiments in accordance with the present invention provide systems and methods for voice triggers that are compatible and complementary with existing systems and methods of electronic device design and manufacture, and digital signal processing.

Various embodiments of the invention are thus described. While the present invention has been described in particular embodiments, it should be appreciated that the invention should not be construed as limited by such embodiments, but rather construed according to the below claims.

What is claimed is:

1. A method comprising:

accessing a one-bit pulse-density modulation bit stream of a voice signal by a pulse-density modulation microphone;

determining a long term average audio energy, via a long term energy averaging circuit, based on said bit stream, wherein said long term energy averaging circuit is further configured to determine an instantaneous energy level of said bit stream as the absolute value of:

2 times a number of one bits in a portion of said bit stream divided by a size of said portion, minus 1;

determining a short term average audio energy based on said bit stream;

comparing said long term average audio energy to said short term average audio energy; and responsive to said comparing, generating a voice trigger signal if said short term average audio energy is greater than said long term average audio energy, wherein said voice trigger signal powers on additional processing elements configured to process said bit stream to determine presence in said bit stream of one of: voice, speech and a valid command phrase.

2. The method of claim 1 wherein said determining said long term average audio energy is performed independent of any decimation on said bit stream.

3. The method of claim 1 wherein said determining said long term average audio energy comprises counting a number of ones in a portion of said bit stream.

4. The method of claim 3 wherein said portion of said bit stream comprises a total number of bits equal to an oversample rate of said bit stream.

5. The method of claim 1 wherein said voice trigger signal is generated if said short term average audio energy is greater than said long term average audio energy plus an offset value.

6. The method of claim 1 wherein said determining said long term average audio energy comprises exponential averaging of a series of energy values with a long term time constant.

7. The method of claim 1 wherein said determining said short term average audio energy comprises exponential averaging of a series of energy values with a short term time constant.

8. An apparatus comprising:

a bit buffer configured to receive a one-bit pulse-density modulation bit stream of a voice signal by a pulse-density modulation microphone;

a counter configured to count a number of one bits in a portion of said bit buffer;

a long term energy averaging circuit configured to perform an exponential averaging of a series of energy values based on said number with a long term time constant, producing a long term average energy, wherein said long term energy averaging circuit is further configured to determine an instantaneous energy level of said bit stream as the absolute value of:

2 times a number of one bits in a portion of said bit buffer divided by a size of said portion, minus 1;

a short term energy averaging circuit configured to perform an exponential averaging of a series of energy values based on said number with a short term time constant, producing a short term average energy;

a comparator configured to compare said short term average energy to said long term average energy; and said comparator also configured to produce a voice trigger signal if said short term average energy is greater than said long term average energy, wherein said voice trigger signal powers on additional processing elements configured to process said bit stream to determine presence in said bit stream of one of: voice, speech and a valid command phrase.

9. The apparatus of claim 8 wherein said voice trigger signal is produced independent of any decimation function.

10. The apparatus of claim 8 wherein said portion of said bit buffer comprises delayed audio data bits stored in said bit buffer.

11. The apparatus of claim 10 wherein said delayed audio data bits represent a delay of at least one oversample rate (OSR) of bits.

12. The apparatus of claim 8 wherein said portion of said bit buffer comprises at least one oversample rate (OSR) of bits.

13. The apparatus of claim 8 wherein said comparator is configured to produce a voice trigger signal if said short term average energy is greater than said long term average energy plus an offset value.

14. The apparatus of claim 8 wherein said bit buffer is further configured to functionally couple to a one-bit pulse-density modulation microphone.

15. A method comprising:

accessing a one-bit pulse-density modulation (PDM) bit stream of a voice signal by a pulse-density modulation microphone;

determining audio energy of said bit stream by counting a number of ones within a portion of said bit stream; and generating a voice trigger signal if a short term average audio energy is greater than a long term average audio energy, determined by a long term energy averaging circuit, based on said bit stream, wherein said long term energy averaging circuit is further configured to determine an instantaneous energy level of said bit stream as the absolute value of:

2 times a number of one bits in a portion of said bit stream divided by a size of said portion, minus 1;

wherein said voice trigger signal powers on additional processing elements to process said bit stream to determine presence in said bit stream of one of: voice, speech and a valid command phrase.

16. The method of claim 15 wherein said portion of said bit stream is delayed by at least one oversample rate (OSR) of said bit stream.

17. The method of claim 15 wherein said portion of said bit stream comprises at least one oversample rate (OSR) bits of said bit stream.

18. The method of claim 15 further comprising computing a long term average energy of said bit stream based on said counting.

19. The method of claim 15 wherein said determining is free of decimation of said pulse-density modulation (PDM) bit stream.

* * * * *